United States Patent [19]

Taft et al.

[11] Patent Number: 5,721,509

[45] Date of Patent: Feb. 24, 1998

[54] CHARGE PUMP HAVING REDUCED THRESHOLD VOLTAGE LOSSES

[75] Inventors: Robert C. Taft, Salem, N.H.; Perry H. Pelley, III, Austin, Tex.

[73] Assignee: Motorola, Inc., Schaumburg, Ill.

[21] Appl. No.: 596,817

[22] Filed: Feb. 5, 1996

[51] Int. Cl.[6] ............................................. G05F 1/10
[52] U.S. Cl. ................................... 327/536; 327/530
[58] Field of Search .......................... 307/110; 327/530, 327/534, 535, 536, 537; 331/57

[56] References Cited

U.S. PATENT DOCUMENTS

| 4,628,215 | 12/1986 | Lou ............................................ 327/536 |
| 4,897,774 | 1/1990 | Bingham et al. ............................ 363/61 |
| 5,179,296 | 1/1993 | Ito ............................................. 327/536 |
| 5,303,190 | 4/1994 | Pelley, III ................................ 365/189 |
| 5,381,051 | 1/1995 | Morton ..................................... 327/390 |
| 5,581,455 | 12/1996 | Rossi et al. ............................. 327/536 |

*Primary Examiner*—Timothy P. Callahan
*Assistant Examiner*—Jeffrey Zweizig
*Attorney, Agent, or Firm*—Bruce E. Hayden

[57] ABSTRACT

A charge pump (40) is implemented with several stages (30), including a control stage (50), in a manner integral with a ring-oscillator loop. The charge pump (40) is more efficient for producing voltage VBB to supply to a substrate well implementing circuitry such as a DRAM or SRAM (61), since there are no threshold voltage drops across any of the critical path transistors (M3) within the charge pump (40). This is accomplished by providing a boosted signal level from the proceeding stage (30). In the design, parasitic diode leakage is negligible.

32 Claims, 4 Drawing Sheets

CHARGE PUMP HAVING REDUCED THRESHOLD VOLTAGE LOSSES

CO-PENDING APPLICATION

This application for patent is related to a co-pending U.S. patent application Ser. No. 08/596,809 filed Feb. 5, 1996 now U.S. Pat. No. 5,726,944, and entitled "VOLTAGE REGULATOR FOR REGULATING AN OUTPUT VOLTAGE FROM A CHARGE PUMP AND METHOD THEREFOR," which is hereby incorporated by reference herein.

FIELD OF THE INVENTION

The present invention relates in general to semiconductor circuits, and in particular, to a charge pump for semiconductor circuits.

BACKGROUND INFORMATION

MOS (metal-oxide semiconductor) circuitry (e.g., static random access memories ("SRAMs"), dynamic random access memories ("DRAMs"), flash memories) is evolving with each generation, resulting in smaller and more complex circuit elements creating design problems. For example, one recurring problem which can arise during the operation of DRAMs is the degradation of data stored on the DRAM memory cell capacitors due to minority carrier injection into the substrate (also referred to as the well). This typically occurs when the address and data lines to the memory device switch low and the corresponding bond pads, which reside on the surface of the substrate, spike below zero volts. This spiking can become particularly pronounced if the inductance of the address and data lines is not well-controlled.

In an N channel memory cell storing a logic 1, a depletion area is created around the N+ doped region common to the access transistor and the storage capacitor of the cell. Minority carriers (in this case, electrons) injected into the substrate from the spiking can recombine with the holes in the depletion area and cause charge to leak-off the storage capacitor. By biasing the substrate at a negative voltage, diodes formed at the bond pad structures cannot be biased and undershoot and, thus, electron injection into the substrate is prevented.

A negative substrate bias is achieved typically by pumping electrons into the substrate with a substrate pump. Generally, pumping is performed until the substrate reaches equilibrium and before any writes are made to the cells of the array.

On-chip DC-to-DC conversion using capacitor charge pumps has found widespread use in back-biased generator circuits for MOS memories. FIG. 1 illustrates such a circuit which generates a negative voltage at VBB.OUT from a single supply, whereby the circuit is activated by an oscillator circuit (not shown). Capacitor C1 is charged through transistor M1 while the output of inverter 10 is positive, and produces a negative voltage through pass transistor M0 while the output of inverter 10 is low. Note that there are two NMOS (N channel MOSFET (MOS field-effect transistor)) threshold voltage ($V_{TN}$) losses, one during the capacitor C1 charging cycle through transistor M1, the other during the capacitor C1 discharging cycle through transistor M0 (transistors M1 and M0 are both NMOS devices). In addition, even with the well of transistor M0 connected to VBB.OUT, the $V_{TN}$ loss of transistor M0 is increased due to back-bias. If the resulting current drive of M0 is insufficient, the forward-biased source regions will inject electron charge into the NMOS p-well and substrate.

The circuit illustrated in FIG. 2 incorporates a substantial improvement in design, where the $V_{TN}$ loss during the charging cycle has been eliminated by cross-coupling two out-of-phase charge pumps, similar to the one illustrated in FIG. 1. In addition, the possibility for electron charge injection has been eliminated by using PMOS (P channel MOSFET) pass transistors M1 and M4. However, the threshold voltage ($V_{TP}$) loss for these pass transistors is substantial, due to the large back-bias, since the PMOS n-well is tied to the positive supply (VDD).

Due to the scaling down of power supplies to 3.3 volts and below in recent years, the pump inefficiency created by even one device threshold voltage ($V_T$) loss is now of concern. Thus, there is a need in the art for an improved circuit design for a charge pump which has reduced transistor threshold voltage losses.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
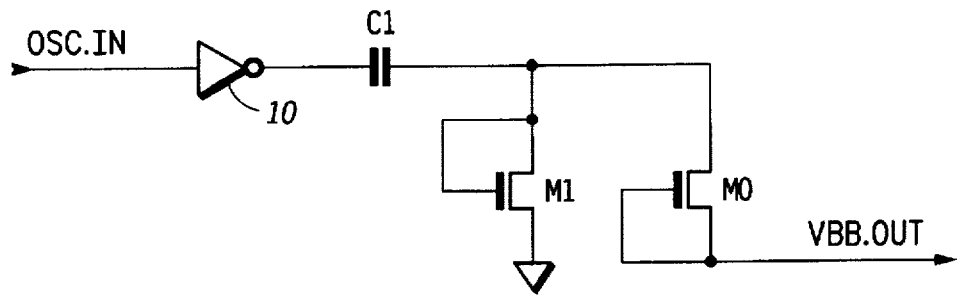
FIG. 1 illustrates a prior art charge pump.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
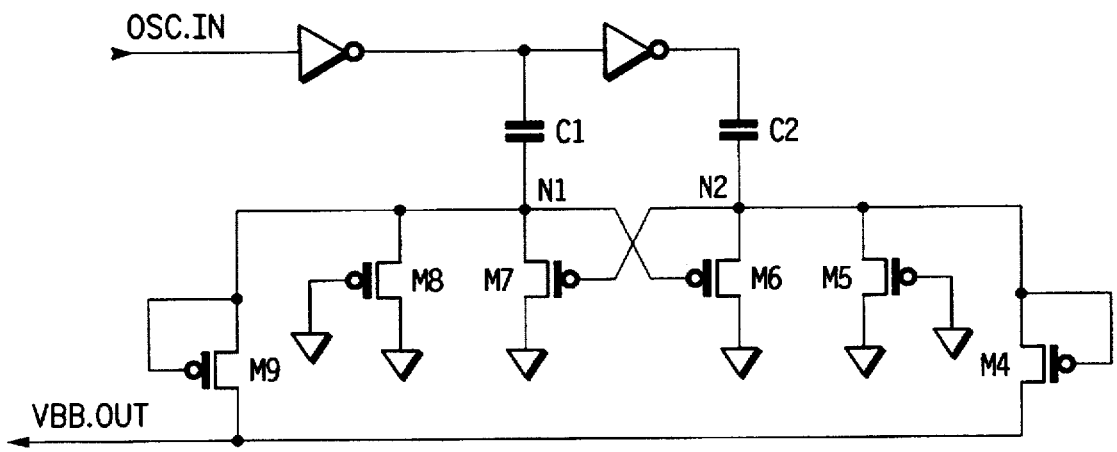
FIG. 2 illustrates another prior art charge pump.
Figure 3:
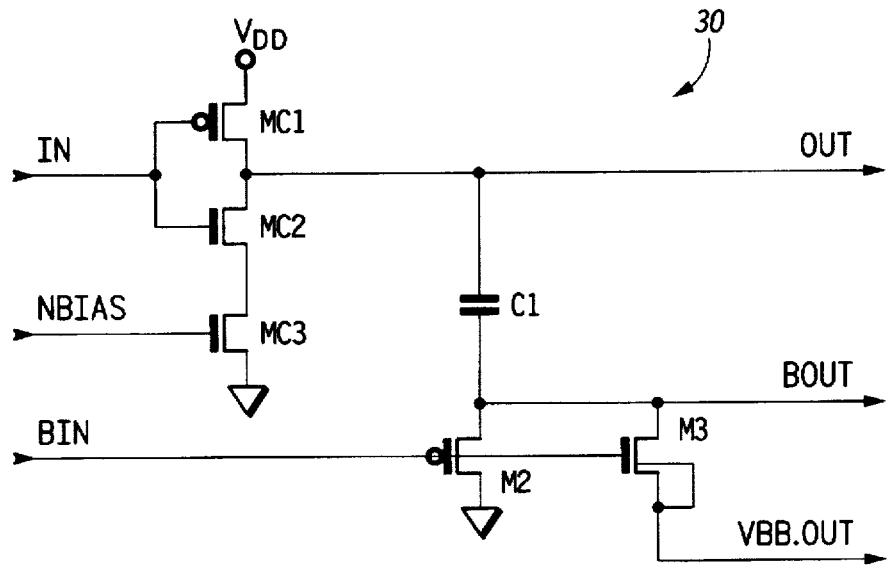
FIG. 3 illustrates one stage of a charge pump in accordance with the present invention.
Figure 4:
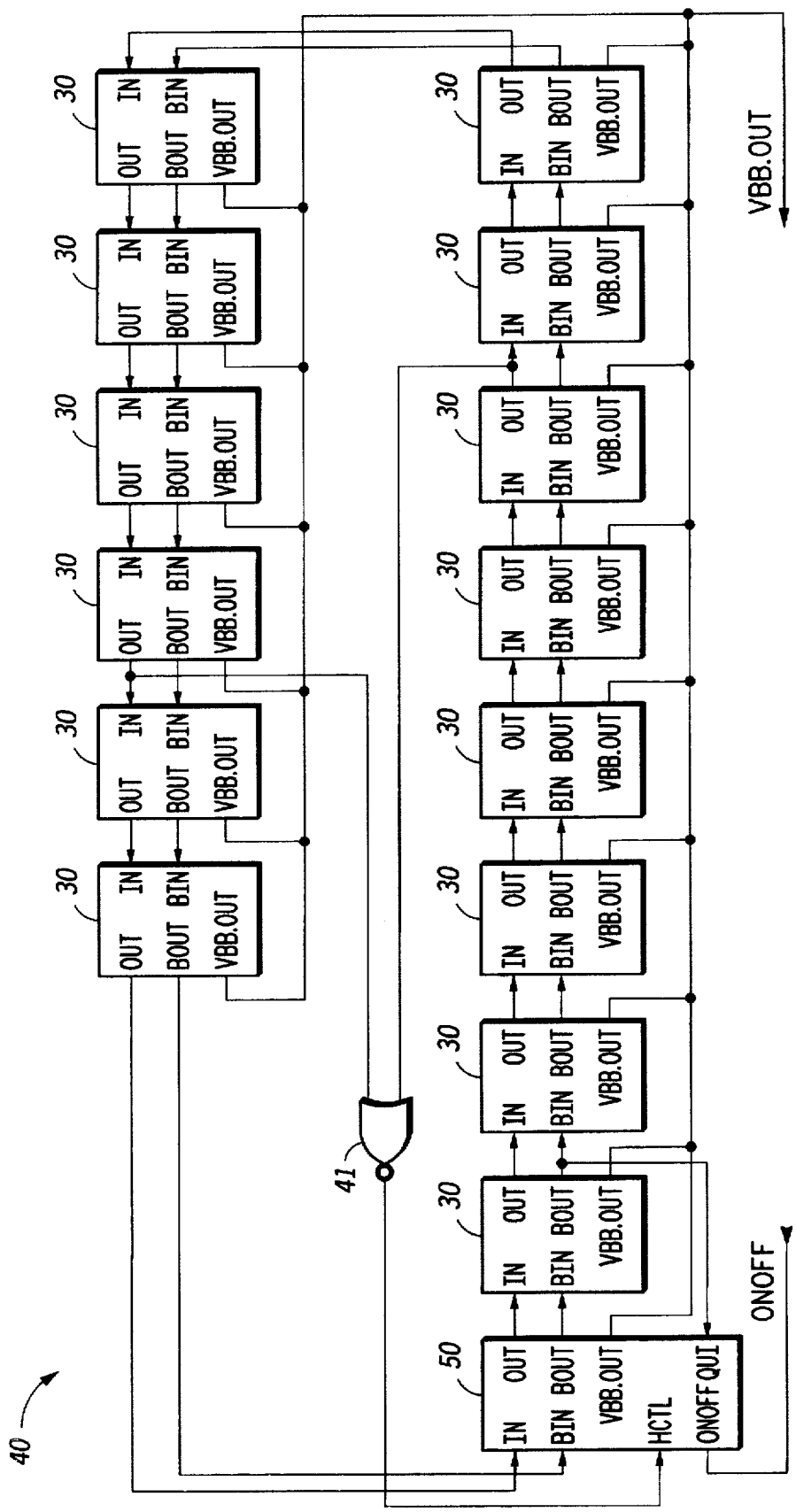
FIG. 4 illustrates the charge pump in accordance with the present invention.

Referring to FIG. 3, there is illustrated one stage (circuit 30) of the feed-forward charge pump shown in FIG. 4. In circuit 30, charging capacitor C1 is integrated as the load capacitor of the basic inverter primarily comprising transistors MC1 and MC2. Circuit 30 forms a stage of a ring-oscillator loop in circuit 40 of FIG. 4. The negative voltage generated on capacitor C1 at node BOUT (boost out) is fed-forward to the next stage's node BIN (boost in). Thus, both the ring-oscillator signal OUT/IN and the boost voltages BOUT/BIN are passed between successive stages as shown in FIG. 4. The boosted voltage BIN not only turns on PMOS transistor M2 hard, avoiding a threshold voltage $V_T$ drop as in the cross-coupled cell shown in FIG. 2, but also switches NMOS transistor M3 between "on" and "off" states. Because of the delay in the inverter comprised of transistors MC1 and MC2 within each stage 30, transistor M3 is turned on before its source is driven negatively, thus preventing source-to-well injection (the pass device M3 is turned on before capacitor C1 is pumped resulting in negligible leakage across a current electrode of M3) through an N junction of transistor M3 to the nearest N-well.

Note that a sufficient number of inverter stages exist to allow capacitor C1 to discharge before the pass transistor M3 is once again turned off. An appropriate number of stages can cause the ring-oscillator to operate outside of its fundamental mode, due to power-up initializing it in a harmonic mode or a stable midpoint mode. NOR gate 41 shown in FIG. 4 can verify the phase and thereby prevent harmonics in the oscillator loop. In addition, if its device sizes are chosen correctly, NOR gate 41 can destabilize the midpoint mode where all inverter outputs are at approximately VDD/2.

Figure 5:
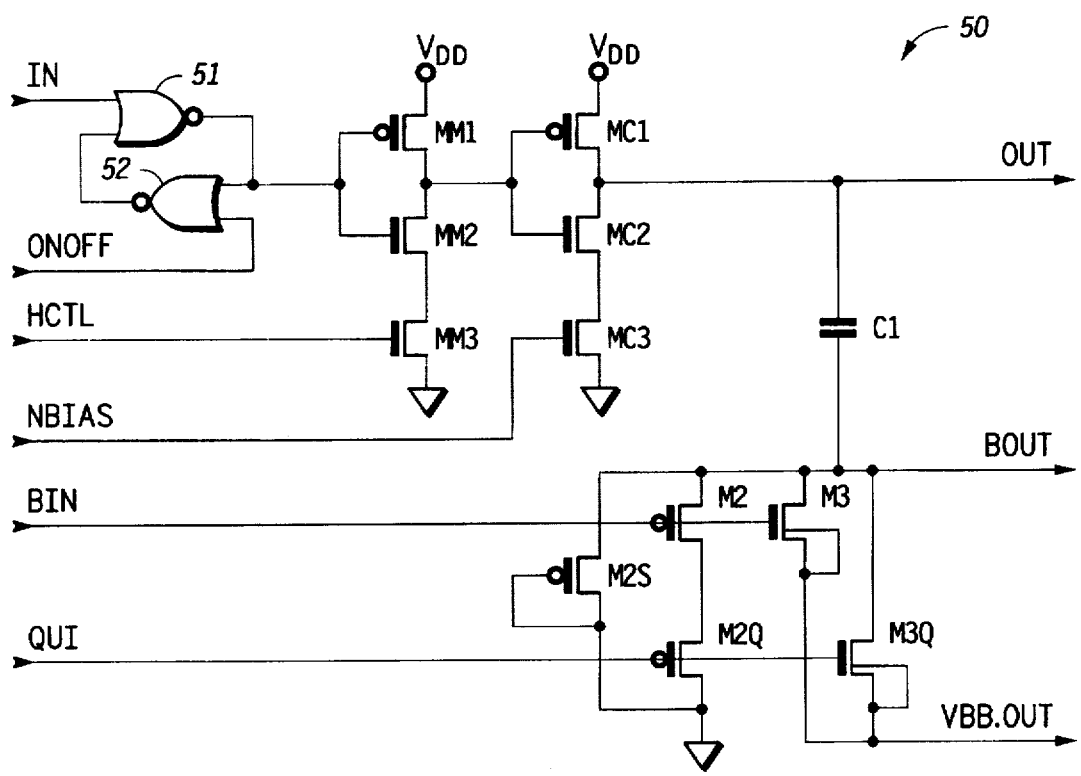
FIG. 5 illustrates a circuit diagram of a control gate in the charge pump illustrated in FIG. 4.

The fundamental mode-establishing NOR gate 41 is tied into the control gate 50, further illustrated in FIG. 5, through node HCTL. Node HCTL going low inhibits the inverter, comprising transistors MM1 and MM2, from going low (caused by a "1" on either of the inputs of NOR gate 41). A "0" arriving at IN does not propagate. In multiple phase operation, the output OUT of control gate 50 will not transition to "1" with either of the inputs to NOR gate 41 high. NOR gate 41 therefore causes circuit 50 to delay extraneous phase transitions until they are not sustainable.

Shown also in FIG. 5 is the NBIAS control on transistor MC3, which stabilizes the inverter speed against supply voltage variations. The NBIAS voltage supplied to transistor MC3 is configured so that transistor MC3 operates as a constant current source.

Transistor M2S initializes the pump at power up. Many cycles of the oscillator may be required to fully charge capacitor C1 during power up. Node QUI is used with a "NAND" gate (series transistors M2 and M2Q) to prevent a VBB.OUT discharge path when the pump is in standby mode (ONOFF is low; oscillator is turned off). During standby mode, the charge established on capacitor C1 may be leaked to ground through PMOS transistors M2 and M2Q, which provides for an inefficient circuit when circuit 40 is again turned on by the ONOFF signal, since many cycles may be required before the voltage at BOUT is achieved again.

During standby mode, OUT and BOUT are at a low state. The output of the following oscillator stage 30 is forced high inputting a "1" into the QUI input of control gate 50. A high input into QUI blocks the leakage path through device M2 and connects BOUT to VBB.OUT. Node IN of control gate 50 will stop at ground leaving BIN low (on). Device M2Q prevents leakage, while device M3Q insures that the charge on capacitor C1 is connected to the VBB.OUT charge reservoir (load), insuring that when the pump is turned on it does not have to repeat the power up initialization of capacitor C1.

The coupled NOR gates 51 and 52 allow regulator control supplying signal ONOFF to smoothly start and stop the pump and to prevent transient forward-biasing of the source electrode of transistor M3, both in control gate 50 and each of the inverters in circuits 30. NOR gates 51 and 52 latch out any further input when ONOFF is off. Once IN toggles the state of NOR gate 51 to a "0", NOR gate 52 goes high locking the state of NOR gate 51. The voltage at OUT and BOUT will be low. Therefore, latching NOR gates 51 and 52 does not cause a partial negative pulse on BOUT (M3 source is VBB.OUT) since the latch can only occur when NOR gate 51 is a "0". The latch has no effect on a low input as NOR gate 52 is already a "1". Latching simply extends the time when NOR gate 51 is a "0". Since circuit 50 does not glitch, neither do any of the other stages. The signal ONOFF may originate from a regulator circuit or any other similar source, which monitors VBB.OUT and produces a high signal when VBB.OUT rises to a predetermined level, so that the charge pump 40 may pump-down the voltage of VBB.OUT to the desired negative voltage level.

Since the feed-forward pump suffers no $V_T$ losses, it can nearly voltage-double with only losses due to parasitic effects. In addition, the distributed charge pump capacitors result in much lower noise injection on the power busses, particularly VBB.

In summary, when circuit 40 is turned on by the ONOFF signal going high, it proceeds to oscillate through stages 30 and stage 50, resulting in the pumping of VBB.OUT to a desired negative voltage level. As the wave front of the oscillator signal travels around the oscillator loop, the stage receiving the wave front pumps-down VBB.OUT while other stages are essentially "idle."

Figure 6:
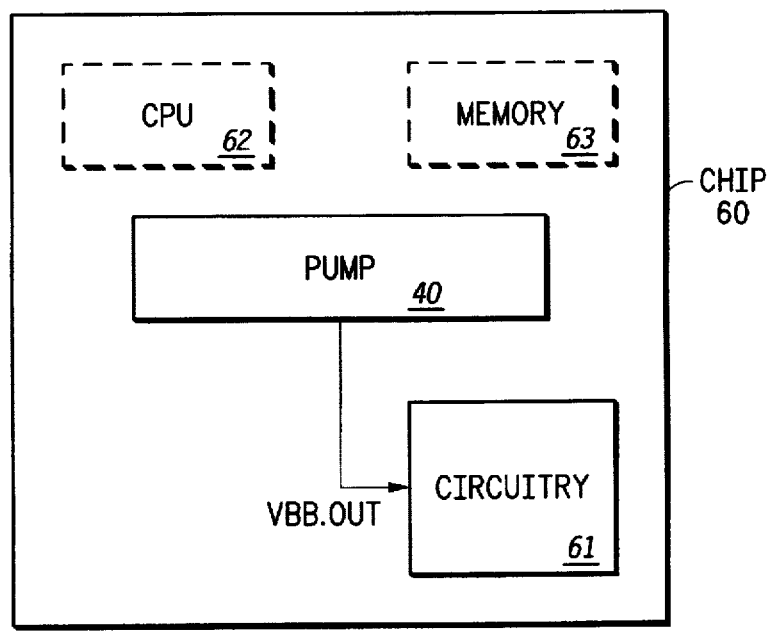
FIG. 6 illustrates an integrated circuit incorporating the charge pump of the present invention.

Referring next to FIG. 6, there is illustrated integrated circuit ("chip") 60, which may comprise any well-known semiconductor integrated circuit, which may include central processing unit ("CPU") 62 and/or memory module 63. Within chip 60, there resides circuitry 61 (which may comprise a DRAM or SRAM) which requires a pumping-down of the substrate for such reasons as described above. This pumping-down is provided by charge pump 40 supplying voltage VBB.OUT to circuitry 61.

Figure 7:
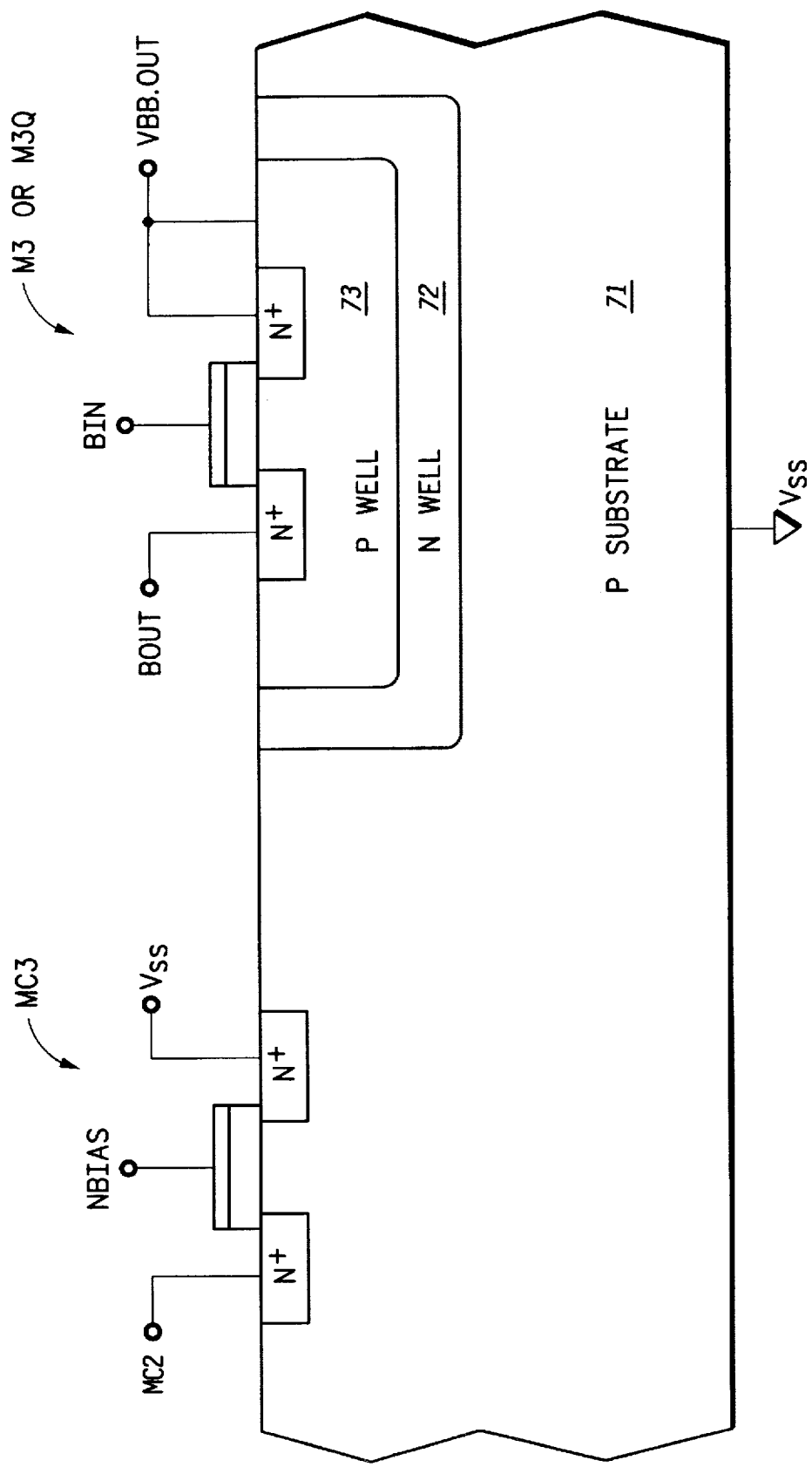
FIG. 7 illustrates well isolation of transistor M3 in circuits 30 and 50.

Referring next to FIG. 7, there is illustrated an example of the isolation of transistor M3, which resides in both circuits 30 and 50. This illustration also may be used to show the isolation of transistor M3Q. Shown is p substrate 71 coupled to voltage source VSS. Other devices with the other devices besides transistors M3 and M3Q within circuits 30 and 50 may be implemented within p substrate 71, such as shown in FIG. 7 with respect to transistor MC3 (the other devices within circuits 30 and 50 implemented within p substrate 71 are not shown for reasons of clarity).

Within p substrate 71 is implemented n-well 72, which has p-well 73 formed therein in order to provide for the isolation of devices M3 and M3Q. P-well 73 is coupled to VBB.OUT as is also shown in circuits 30 and 50.

Each time a stage 30, or circuit 50, is activated by the passing of the oscillator wave front (BIN goes high at the activated stage), VBB.OUT is forced more negative because there is charge sharing across transistor M3 between BOUT and VBB.OUT. Since capacitor C1 is pumping BOUT negative, and since BOUT is more negative than VBB.OUT, this charge sharing thus forces VBB.OUT more negative.

The isolation of transistor M3 results in transistor M3 having negligible parasitic bipolar current injection as BOUT goes negative (i.e., the source/drain junctions within device M3 do not turn on). Thus, parasitic effects are limited to the inherent parasitic effects of the FETs, allowing for a more efficient pump for producing VBB.OUT.

As an alternative, the circuitry of the charge pump may be implemented within a n-well where an p-well is formed therein to locate the NFETs. PFETs will be located directly within the n-well. A more highly doped P+ region may be formed within the p-well for coupling VBB.OUT.

As a further alternative, device M3 and M3Q could be implemented in the same pumped p-well as the other NFETs in the integrated circuit.

Furthermore, the device types and wells could be reversed so that the charge pump creates a positive voltage supply.

Although the present invention and its advantages have been described in detail, it should be understood that various other changes, substitutions and alterations can be made herein without departing from the spirit and scope of the invention as defined by the appended claims.

What is claimed is:

1. A charge pump comprising:
   an oscillator circuit comprising a plurality of stages;
   a capacitor coupled to said oscillator circuit;
   an output terminal;
   a pass device that has a substantially zero threshold voltage drop, wherein:
      said pass device is coupled between said capacitor and said output terminal, and
      the pass device is gated from a previous stage; and
   a precharge device wherein:
      the precharge device is coupled between said capacitor and ground, and
      the precharge device is gated from the previous stage.

2. The charge pump of claim 1 wherein:
   the oscillator circuit is a ring of inverters.

3. The charge pump of claim 2 wherein:
   the pass device in a stage is gated on at a same time as an inverter in the stage is triggered,
   the inverter in the stage is one of the ring of inverters, and
   an output through the pass device occurs a stage delay later.

4. The charge pump of claim 2 wherein:
   the precharge device in a stage is gated on at a same time as an inverter in the stage is triggered,
   the inverter in the stage is one of the ring of inverters, and
   charging of the capacitor in the stage occurs a stage delay later.

5. The charge pump of claim 4 wherein:
   the pass device in the stage is gated at a same time as an inverter in the stage is triggered,
   an output through the pass device occurs the stage delay later.

6. The charge pump of claim 1 wherein:
   the pass device is triggered off at a same time as the precharge device is triggered on.

7. The charge pump of claim 1 wherein:
   the pass device is triggered on at a same time as the precharge device is triggered off.

8. The charge pump of claim 1 wherein:
   a combination of the pass device and the precharge device each triggered by the previous stage result in doubled voltage less minimal second order parasitic losses.

9. The charge pump as recited in claim 1, wherein said pass device is a semiconductor device having a substrate isolated from substrate implementing devices comprising said oscillator circuit and said capacitor.

10. The charge pump as recited in claim 9, wherein said substrate of said pass device is connected to said output terminal.

11. The charge pump as recited in claim 1, wherein said pass device is an NFET with its p-well connected to said output terminal and to a drain of said NFET.

12. The charge pump as recited in claim 1, further comprising circuitry, coupled to said capacitor, for preventing leakage of charge from said capacitor to ground.

13. The charge pump as recited in claim 1, further comprising circuitry, coupled to said oscillator circuit, for activating and deactivating said charge pump.

14. The charge pump as recited in claim 1, wherein said pass device is turned on before said capacitor is pumped resulting in negligible leakage across a current electrode of said pass device.

15. A charge pump comprising a plurality of stages coupled in a ring, wherein each of said plurality of stages further comprises:
   an inverter;
   a capacitor coupled to an output terminal of said inverter;
   an output terminal of said each of said plurality of stages;
   a pass device that has a substantially zero threshold voltage drop, wherein:
      said pass device is coupled between said capacitor and said output terminal of said each of said plurality of stages, and
      the pass device is gated from a previous one of said plurality of stages; and
   a precharge device wherein:
      the precharge device is coupled between said capacitor and ground, and
      the precharge device is gated from the previous one of said plurality of stages.

16. The charge pump as recited in claim 15, wherein said pass device is a semiconductor device having a substrate isolated from a substrate implementing other devices in said charge pump.

17. The charge pump as recited in claim 16, wherein said substrate of said pass device is connected to said output terminal of said each of said plurality of stages.

18. The charge pump as recited in claim 15, wherein said pass device is an NFET with its p-well connected to said output terminal of said each of said plurality of stages and to a drain of said NFET.

19. The charge pump as recited in claim 15, further comprising: a switching circuit coupled between ground and a junction between said capacitor and said pass device, wherein said switching circuit is coupled to said previous stage, and wherein said junction is coupled to a switching circuit in said subsequent stage.

20. The charge pump as recited in claim 15, wherein output terminals of said each of said plurality of stages are coupled together.

21. The charge pump as recited in claim 19, wherein said pass device is an NFET with its p-well connected to said output terminal of said each of said plurality of stages.

22. The charge pump as recited in claim 15, wherein one of each of said plurality of stages further comprises:
   circuitry, coupled to said capacitor, for preventing leakage of charge from said capacitor to ground.

23. The charge pump as recited in claim 15, wherein one of said each of said plurality of stages further comprises:
   circuitry, coupled to said inverter, for activating and deactivating said charge pump.

24. The charge pump as recited in claim 22, wherein said circuitry for preventing leakage of charge from said capacitor to ground further comprises a PFET coupled between said capacitor and ground, wherein a gate electrode of said PFET is coupled to an output of a subsequent stage.

25. The charge pump as recited in claim 15, further comprising circuitry for preventing harmonics in an oscillator circuit comprised of said inverter of said each of said plurality of stages.

26. The charge pump as recited in claim 25, wherein said circuitry for preventing harmonics further comprises a NOR gate having its inputs coupled to outputs of two of said each of said plurality of stages, wherein an output of said NOR gate is coupled to said inverter.

27. The charge pump as recited in claim 18, wherein one of said each of said plurality of stages further comprises:

a second NFET, with its p-well connected to said output terminal of said each of said plurality of stages, coupled between said capacitor and said output terminal of said each of said plurality of stages, wherein a gate electrode of said second NFET is coupled to another of said each of said plurality of stages;

the precharge device is a first PFET coupled to said capacitor;

a second PFET coupled between said first PFET and ground; and a third PFET coupled between said capacitor and ground, wherein gate electrodes of said pass device and said first PFET are coupled to a second capacitor in a previous stage of said each of said plurality of stages, and wherein a gate electrode of said second PFET and a gate electrode of said second NFET are coupled to a third capacitor of a subsequent stage of said each of said plurality of stages, and wherein a gate electrode of said third PFET is coupled to ground.

28. An integrated circuit comprising:

a semiconductor circuit; and a charge pump operable for providing a voltage source to a substrate implementing said semiconductor circuit, wherein said charge pump further comprises:

a plurality of stages coupled in a ring, wherein each of said plurality of stages further comprises:

an inverter;

a capacitor coupled to an output terminal of said inverter;

an output terminal; and a pass device that has a substantially zero threshold voltage drop, wherein:

said pass device is coupled between said capacitor and said output terminal of said each of said plurality of stages, and the pass device is gated from a previous stage; and a precharge device wherein:

the precharge device is coupled between said capacitor and ground, and the precharge device is gated from the previous stage.

29. The charge pump as recited in claim 28, wherein said semiconductor circuit is a memory circuit, wherein said pass device is a semiconductor device having a substrate isolated from a substrate implementing other devices in said charge pump, wherein said substrate of said pass device is connected to said output terminal of said each of said plurality of stages.

30. The charge pump as recited in claim 29, wherein an input terminal of said inverter is coupled to an output terminal of an inverter in a previous stage, and wherein an output terminal of said inverter is coupled to an input terminal of an inverter of a subsequent stage, and wherein said output terminal of said inverter is coupled to said capacitor.

31. The charge pump as recited in claim 30, wherein said pass device is an NFET with its p-well connected to said output terminal of said each of said plurality of stages.

32. The charge pump as recited in claim 31, wherein said pass device of each of said plurality of stages is biased by an output voltage provided at the output terminal of a previous stage of said plurality of stages, for causing said pass device to be conductive, and having negligible diode leakage current, prior to said capacitor being pumped by said previous stage.

* * * * *